United States Patent
Ogura et al.

(10) Patent No.: US 6,805,979 B2
(45) Date of Patent: Oct. 19, 2004

(54) TRANSFER FILM AND PROCESS FOR PRODUCING ORGANIC ELECTROLUMINESCENT DEVICE USING THE SAME

(75) Inventors: Takashi Ogura, Nara (JP); Shinji Yamana, Yamatokoriyama (JP); Tomonori Akai, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 101 days.

(21) Appl. No.: 10/136,518

(22) Filed: May 2, 2002

(65) Prior Publication Data

US 2002/0172813 A1 Nov. 21, 2002

(30) Foreign Application Priority Data

May 18, 2001 (JP) ........................................ 2001-148587

(51) Int. Cl.[7] .............................. B32B 7/02; H05B 33/10
(52) U.S. Cl. ...................... 428/690; 428/212; 428/917; 428/32.6; 313/504; 313/506; 156/67; 427/66; 430/200
(58) Field of Search ................................ 428/212, 690, 428/917, 32.6, 32.77, 32.8, 32.81; 156/67, 57; 427/66; 430/200; 313/504, 506

(56) References Cited

U.S. PATENT DOCUMENTS 6,080,479 A * 6/2000 Sogabe et al. ............ 428/32.79
6,140,009 A    10/2000 Wolk et al.

FOREIGN PATENT DOCUMENTS

| EP | 1 003 354 A1 | * 5/2000 |
|---|---|---|
| JP | 05-275172 | 10/1993 |
| JP | 08-227276 | 9/1996 |
| JP | 08-315981 | 11/1996 |
| JP | 09-167684 | 6/1997 |
| JP | 10-208881 | 8/1998 |
| JP | 11-011032 | 1/1999 |
| JP | 11-135257 | 5/1999 |
| JP | 11-237504 | 8/1999 |
| JP | 11-260549 | 9/1999 |
| JP | 2000-012216 | 1/2000 |
| JP | 2000-077182 | 3/2000 |
| WO | 00/41892 | 7/2000 |
| WO | 00/41893 | 7/2000 |

* cited by examiner

Primary Examiner—Dawn L. Garrett
(74) Attorney, Agent, or Firm—Nixon & Vanderhye P.C.

(57) ABSTRACT

A transfer film comprising a base film, a transfer layer, and a transfer auxiliary layer formed between the base film and the transfer layer so as to be in contact with at least the transfer layer, this transfer auxiliary layer having a melting point or a glass transition temperature lower than that of the transfer layer, wherein at least a portion of the transfer layer can be thermally transferred onto a substrate.

15 Claims, 3 Drawing Sheets

TRANSFER FILM AND PROCESS FOR PRODUCING ORGANIC ELECTROLUMINESCENT DEVICE USING THE SAME

CROSS-REFERENCE TO RELATED APPLICATIONS

This application is related to Japanese Patent Application No. 2001-148587 filed on May 18, 2001 whose priority is claimed under 35 USC § 119, the disclosure of which is incorporated by reference in its entirety.

BACKGROUND OF THE INVENTION

1. Field of the Invention

The present invention relates to a transfer film and a process for producing an organic electroluminescent device using the same.

2. Description of the Prior Arts

Recently, there is more need for a flat panel display as a thin and light-weight display device with reduced power consumption, compared to a cathode-ray tube (CRT).

Known as the flat panel display device are a non-luminous liquid crystal display (LCD), a self-luminous plasma display panel (PDP), an electroluminescent (EL; referred to as EL hereafter) display or the like.

Among these displays, the EL display is classified into two types, i.e., an inorganic EL display and an organic EL display, from the viewpoint of a difference in its luminous mechanism and component materials. Particularly, attention has been greatly paid on the organic EL display since it has characteristics of being self-luminous, achieving reduced power consumption, having various luminous colors or the like.

An organic EL device used for the organic EL display has a structure such that an organic light-emitting layer and, according to need, a hole injecting/transporting layer and an electron injecting/transporting layer are sandwiched between a pair of electrodes, at least one of which is transparent. Research has widely been carried out on the EL device since it can be driven at low voltage as well as can luminesce with high luminance.

When a matrix display or color display is to be manufactured in the manufacturing process as described above of the organic EL element used for the organic EL display, a light-emitting layer or cathode is required to be formed into a predetermined pattern. However, an organic material composing the organic EL device is susceptible to damages such as a corrosion or degradation in characteristic due to organic solvent, water, oxygen or the like. Therefore, it is generally difficult to form a pattern by a general photolithography method once a layer containing an organic material is formed.

Methods for performing a pattern formation of light-emitting layers, each of which has a different luminous color, or a cathode include a mask vapor-deposition method for performing a pattern formation by a mask vapor-deposition, a method in which a partitioning wall is formed in advance for performing a pattern formation by a vapor-deposition, an inkjet method for performing a pattern formation by using an ink jet process or the like. These methods are disclosed in, for example, Japanese Unexamined Patent Application Nos. HEI11-135257, HEI8-315981, HEI8-227276 and HEI5-275172. However, the method for forming a pattern formation by the vapor-deposition is not considered to be satisfactory from the viewpoint of production because of the following reasons such that it is difficult to achieve a high precision of the pattern, it is difficult to perform an alignment of a mask with a throwing power considered or the process becomes complicated. Further, the mask vapor-deposition method has a problem that it is difficult to vapor-deposit onto a large-sized substrate, while the ink jet method has a problem of declining productivity since it takes much time to perform the pattern formation by using a large-sized substrate.

On the other hand, a pattern formation method using a transfer method has been known as a method taking the place of the above-mentioned pattern formation. The pattern formation method using the transfer method utilizes a thermal supply by light obtained by laser irradiation or a localized heating element, and is disclosed in Japanese Unexamined Patent Application Nos. HEI9-167684, HEI10-208881, HEI11-237504, HEI11-260549, 2000-12216 and 2000-77182. The pattern formation method using the transfer method can use a large-sized substrate, whereby attention has been paid on this method as a patterned method capable of remarkably shortening a working time.

FIG. 4 shows a sectional view for explaining a conventional pattern formation method using a transfer method with a laser irradiation.

FIG. 4 represents a conventional transfer film and a portion of a process for producing an organic EL device using the same. In this process, a light-to-heat conversion layer 42 and a thermal transmission layer 43 are formed on a film 41, followed by the formation of a cathode layer 44. Subsequently, a light-emitting layer 45b is laminated thereon, and then, a hole injecting/transporting layer 45c is laminated. Thereafter, the film-formed side of the film 41 is attached to a substrate 47 on which a stripe-patterned ITO anode 48 is formed. Then, YAG laser 51 of 13W is selectively irradiated from the backside of the film 41 for forming a cathode shape, whereby a multi-layer 46 is transferred onto the substrate 47. Thereafter, the film 41 is removed, and then, the substrate 47 on which the multi-layer 46 is transferred is connected to a driving means for performing a sealing process, to thereby obtain an organic EL display.

This pattern formation method using the transfer method with a laser irradiation is a dry-type method, so that the organic material composing the organic EL device does not suffer damages from organic solvent or water, as well as that a high-precise pattern can be formed.

However, the aforesaid conventional technique has following problems.

In the case of transferring the multi-layer in the conventional pattern formation method using the transfer method, a satisfactory transfer cannot sometimes be executed due to a difference in melting point of each layer or a laminating order. Further, even when the satisfactory transfer can be obtained, the transfer layer suffers damages from heat if the temperature greatly rises upon transferring, thereby entailing a problem of deteriorating the transfer layer.

SUMMARY OF THE INVENTION

The present invention is accomplished for solving the above-mentioned problems, and aims to solve the above-mentioned problems relating to a transfer film and a process for producing an organic EL device using the same and to provide a transfer film and a process for producing an organic EL device using the same.

The present invention provides a transfer film comprising a base film, a transfer layer, and a transfer auxiliary layer formed between the base film and the transfer layer so as to be in contact with at least the transfer layer, this transfer auxiliary layer having a melting point or a glass transition temperature lower than that of the transfer layer, wherein at least a portion of the transfer layer can be thermally transferred onto a substrate.

Further, the present invention provides a process for producing an organic EL device comprising the step of attaching to a substrate a transfer film comprising a base film, a transfer layer to be a constituent layer of the organic EL device and a transfer auxiliary layer formed between the base film and the transfer layer so as to be in contact with at least the transfer layer, this transfer auxiliary layer having a melting point or a glass transition temperature lower than that of the transfer layer, in such a manner that the transfer layer is in contact with a face of the substrate on which the transfer layer is to be transferred: and the step of heating the transfer auxiliary layer from the base film side for transferring at least a portion of the transfer layer onto the substrate, to thereby form the constituent layer of the organic EL device.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit of and scope of the invention will become apparent to those skilled in the art from this detailed description.

BRIEF DESCRIPTION OF THE DRAWINGS

The present invention will become more fully understood from the detailed description given hereinafter and the accompanying drawings that are given by way of illustration only, and thus are not to be considered as limiting the present invention.

DESCRIPTION OF THE PREFERRED EMBODIMENT

Figure 1:
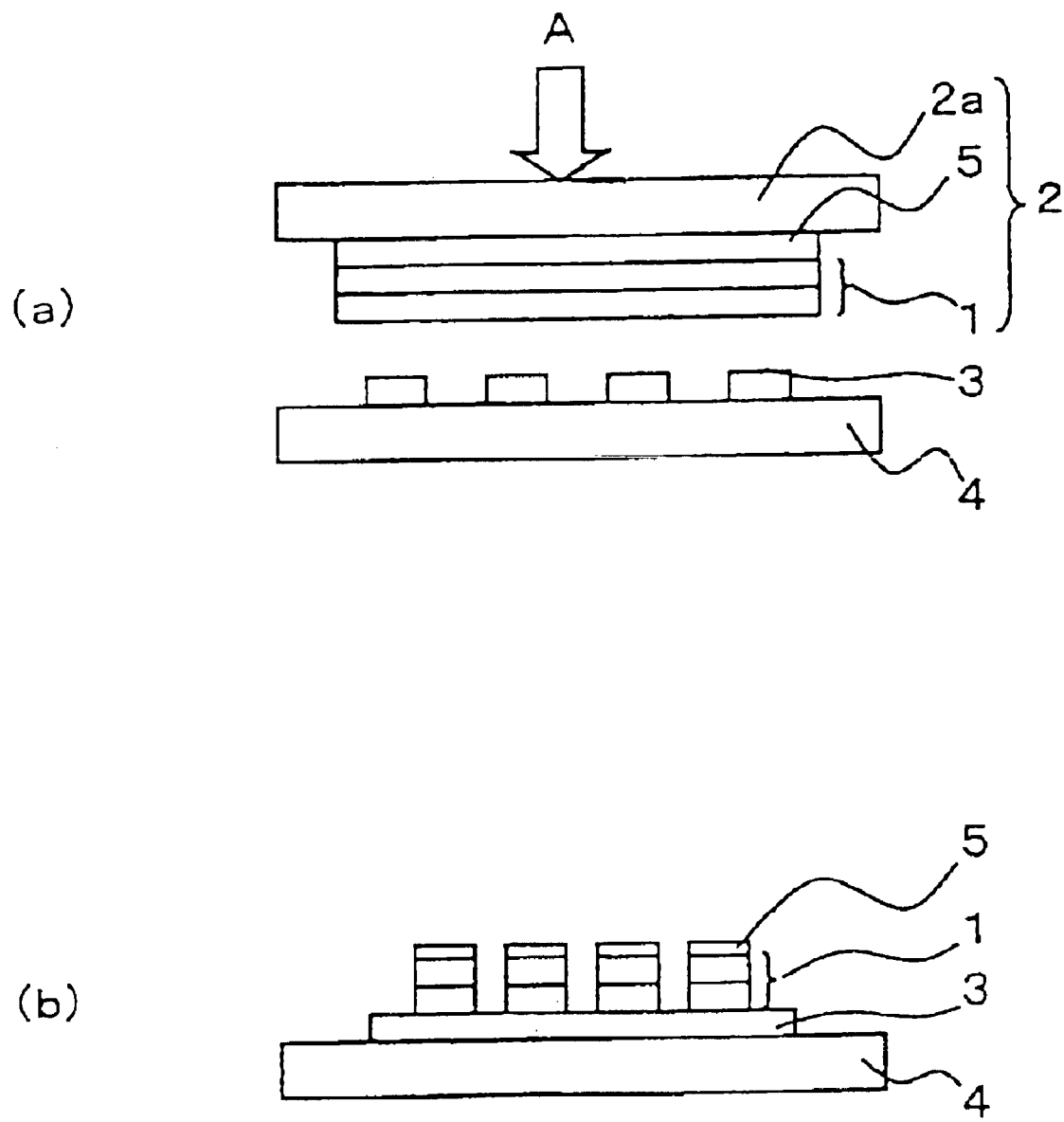
FIG. 1 is a typical sectional view showing a transfer film and a process for producing an organic EL device using the same in an embodiment of the present invention.

A transfer film and a process for producing an organic EL device using the same in an embodiment of the present invention will be explained in detail hereinafter, by which the invention is not limited.

The transfer film has formed on a base film a transfer layer that is to be transferred by a transfer method. A transfer auxiliary layer is formed between the base film and the transfer layer so as to be in contact with at least the transfer layer.

A transparent flexible material is preferable for the base film. When the transfer is performed with a laser irradiation, a material having high transmittance of laser light used for the transfer is particularly preferable. A material having high flexibility enables that the transfer film can be attached to an irregular substrate without space. Examples of such a material include a polymer such as polyethylene terephthalate (PET), polycarbonate (PC), polymethylmethacrylate (PMMA), polyester, polyacryl, polyepoxy, polyethylene, polystyrene, polyethersulfone or the like, among which PET and PC are most preferable. A thickness is preferably 10 to 600 $\mu$m, more preferably 50 to 200 $\mu$m.

The transfer auxiliary layer is made of a material having a melting point or a glass transition temperature lower than that of the transfer layer. It is fused with heat for transferring the transfer layer onto the substrate. Usable materials for the transfer auxiliary layer include aromatic compound such as diphenylamine, triphenylene, para-terphenyl or the like, saturated fatty acid compound such as stearic acid, behenic acid or the like or a polymer. The material usable for the transfer auxiliary layer is not limited to these materials. Although known materials can be used therefor if they have a melting point or a glass transition temperature lower than that of the transfer layer, stearic acid is most preferable.

When the transfer is performed by using the transfer auxiliary layer, a portion of or a whole transfer auxiliary layer may sometimes be transferred. In this case, a conductive material is preferably used for the transfer auxiliary layer. If an insulating material has to be used, the transfer auxiliary layer is preferably thin as much as possible, since the thin transfer auxiliary layer can prevent the rise in driving voltage of the organic EL device.

The transfer layer is actually transferred in the transfer process. The transfer layer used for the process of the present invention may have a structure of, for example, having only an organic layer composing the general organic EL device or having a combination of at least one electrode layer and an organic layer. For example, the following structure may be applied thereto, but the present invention is not limited thereto.

(1) Organic layer
(2) First electrode/Organic layer
(3) Organic layer/Second electrode
(4) First electrode/Organic layer/Second electrode Each layer may be formed in this order or in the reverse order with respect to the base film.

The organic layer may have a single-layer structure or a multi-layer structure. For example, the following structure may be applied, but the invention is not limited thereto.

(1) Organic light-emitting layer
(2) Hole transporting layer
(3) Electron transporting layer
(4) Hole injecting layer
(5) Hole transporting layer/Organic light-emitting layer
(6) Hole injecting layer/Hole transporting layer
(7) Organic light-emitting layer/Electron transporting layer
(8) Hole transporting layer/Organic light-emitting layer/Electron transporting layer
(9) Hole injecting layer/Hole transporting layer/Organic light-emitting layer/Electron transporting layer
(10) Hole injecting layer/Hole transporting layer/Organic light-emitting layer/Blocking layer/Electron transporting layer The above-mentioned organic light-emitting layer may be a single layer or a multi-layer structure.

The organic light-emitting layer can be formed by a known method. For example, an organic light-emitting material can be directly formed by a dry process such as a vacuum vapor-deposition method, EB method, MBE method, sputtering method or the like. Further, the organic light-emitting layer can be formed, for example, by using coating solution for forming the organic light-emitting layer with a wet process such as a spin coating method, dip coating method, doctor blade method, discharge coating method, spray coating method, ink jet method, letterpress printing method, intaglio printing method, screen printing method, microgravure coating method or the like.

The coating solution for forming the organic light-emitting layer is solution containing at least a light-emitting material. It may contain one type or various types of light-emitting material. It may further contain a binding resin. In addition to these, it may contain a leveling agent, luminous assisting agent, electron transporting agent, additive (such as donor, acceptor or the like) or luminescent dopant.

Known light-emitting materials for the organic EL device can be used. These light-emitting materials are classified into a low-molecular light-emitting material, polymer light-emitting material and precursor of the polymer light-emitting material. Specific examples of these compounds are exemplified hereinafter, by which the present invention is not limited.

Examples of the low-molecular light-emitting compound include an aromatic dimethylidyne compound such as 4,4'-bis(2,2'-diphenylvinyl)biphenyl (DPVBi), oxadiazole compound such as 5-methyl-2-[2-[4-(5-methyl-2-benzoxazolyl)phenyl]vinyl]benzoxazole, triazole derivative such as 3-(4-biphenylyl)-4-phenyl-5-t-butylphenyl-1,2,4-triazole (TAZ), styrylbenzene compound such as 1,4-bis(2-metylstyryl)benzene, fluorescent organic material such as thiopyrazine dioxide derivative, benzoquinone derivative, naphthoquinone derivative, anthraquinone derivative, diphenoquinone derivative, fluorenone derivative or the like, fluorescent organic metal compound such as azomethine zinc complex, (8-quinolinolato) aluminum complex ($Alq_3$) or the like.

Examples of polymer light-emitting material include poly(2-decyloxy-1,4-phenylene) (DO-PPP), poly[2,5-bis-[2-(N,N,N-triethylammnoium)ethoxy]-1,4-phenyl-altho-1,4-phenylene]dibromide (PPP-NEt$^{3+}$), poly[2-(2'-ethylhexyloxy)-5-methoxy-1,4-phenylenevinylene] (MEH-PPV), poly[5-methoxy-(2-propanoxysulfonide)-1,4-phenylenevinylene] (MPS-PPV), poly[2.5-bis(hexyloxy)-1,4-phenylene-(1-cyanovinylene)] (CN-PPV), (poly(9,9-dioctylfluorene)) (PDAF) or the like.

Examples of the precursor of the polymer light-emitting material include poly(p-phenylenevinylene) precursor (Pre-PPV), poly(p-naphthalenevinylene) precursor (Pre-PNV), poly-(p-phenylene) precursor (Pre-PPP) or the like.

Examples of the binding resin include polycarbonate, polyester or the like, by which the present invention is not limited.

A solvent that can dissolve or disperse the above-mentioned light-emitting materials may be used. Examples of the solvent include pure water, methanol, ethanol, THF (tetrahydrofuran), chloroform, toluene, xylene, trimethylbenzene or the like.

The hole transporting layer and the electron transporting layer may be a single-layer structure or multi-layer structure. In the following explanation, a hole and electron are referred to as "charge" in combination.

The charge transporting layer can be formed by a known method. For example, a charge transporting material can directly be formed by a dry process such as a vacuum vapor-deposition method, EB method, MBE method, sputtering method or the like. Further, the charge transporting layer can be formed, for example, by using coating solution for forming the charge transporting layer with a wet process such as a spin coating method, dip coating method, doctor blade method, discharge coating method, spray coating method, ink jet method, letterpress printing method, intaglio printing method, screen printing method, microgravure coating method or the like.

The coating solution for forming the charge transporting layer is solution containing at least a charge transporting material. It may contain one type or various types of charge transporting material. It may further contain a binding resin. In addition to these, it may contain a leveling agent or additive (such as donor, acceptor or the like) or or the like, but the invention is not limited by these.

Known charge transporting materials for the organic EL device and organic photoconductor can be used. Specific examples of these compounds are exemplified hereinafter, by which the present invention is not limited.

Examples of the hole transporting material include an inorganic p-type semiconductive material, an aromatic tertiary amine compound such as porphyrin compound, N,N'-bis(3-methylphenyl)-N,N'-bis(phenyl)-bendizine (TPD), N,N'-di(naphthalene-1-yl)-N,N'-diphenyl-bendizine (NPD) or the like, low-molecular material such as hydrozone compound, quinacridone compound, styrylamine compound or the like, polymer material such as polyanniline (PANI), 3,4-polyethylenedioxythiophene/polystyrenesulphonate (PEDT/PSS), poly(triphenylamine derivative) (Poly-TPD), polyvinylcarbazole (PCVz) or the like, or polymer material precursor such as poly(p-phenylenevinylene) precursor (Pre-PPV), poly(p-naphthalenevinylene) precursor (Pre-PNV) or the like.

Examples of the electron transporting material include an inorganic n-type semiconductive material, a low-molecular material such as oxadiazole derivative, triazole derivative, thiopyrazine dioxide derivative, bezoquinone derivative, nahthoquinone derivative, anthraquinone derivative, diphenoquinone derivative, fluorenone derivative or the like, or a polymer material such as poly(oxadiazole) (Poly-OXZ) or the like.

Examples of the binding resin include polycarbonate, polyester or the like, by which the present invention is not limited.

A solvent that can dissolve or disperse the above-mentioned charge transporting materials may be used. Examples of the solvent include pure water, methanol, ethanol, THF, chloroform, xylene, trimethylbenzene or the like.

The blocking layer layer be a single-layer structure or multi-layer structure. The coating solution for forming the blocking layer is solution containing at least a charge blocking material. It may contain one type or various types of charge blocking material. It may further contain a binding resin. In addition to these, it may contain a leveling agent or the like, but the invention is not limited by these.

Known charge blocking materials for the organic EL device can be used. Specific examples of the charge blocking material are 4,7-diphenyl-1,10-phenanthroline, 2,9-dimethyl-1,10-phenanthroline or the like, by which the invention is not limited.

Examples of the binding resin include polycarbonate, polyester or the like, by which the present invention is not limited.

A solvent that can dissolve or disperse the above-mentioned charge blocking materials may be used.

Examples of the solvent include pure water, methanol, ethanol, THF, chloroform, xylene, trimethylbenzene or the like.

Known electrode material can be used for the electrode material of the invention. The anode can utilize a metal having a high work function (Au, Pt, Ni or the like) or a transparent electrode (ITO, IDIXO, $SnO_2$ or the like). The cathode can utilize a material containing at least a metal having a low work function (Ca, Ce, Cs, Rb, Ba, Al, Mg:Ag alloy, Li:Al alloy) or a combination of a thin-film insulating layer and metal electrode (LiF/Al or the like). Further, these materials can be formed by EB method, sputtering method, resistance heating vapor-deposition method or the like, but the invention is not limited by these.

Subsequently explained is a process for producing an organic EL device using the transfer film according to the embodiment of the invention. It is to be noted that the present invention is not limited by the explanation.

FIGS. 1(a) and (b) are typical sectional views each showing a transfer film of the embodiment in the invention and a process for producing an organic EL device using the same. FIG. 1(b) is a typical sectional view when seen from a side perpendicular to the side shown in FIG. 1(a).

As shown in FIGS. 1(a) and (b), a transfer film 2 on which a transfer layer 1 is formed and a substrate 4 on which a first electrode 3 is formed are attached to each other such that the transfer layer 1 opposes to the first electrode 3. Then, heat A is irradiated from a base film 2a side (from a base film 2a side of the transfer film 2). Formed between the base film 2a and the transfer layer 1 is a transfer auxiliary layer 5 that is in contact with at least the transfer layer 1 and has a melting point lower than that of the transfer layer 1. A portion of the heated transfer auxiliary layer 5 is fused, so that at least a portion of the transfer layer 1 is transferred onto the substrate 4. Thereafter, a second electrode is formed according to need, to thereby complete an organic EL device. A series of the transfer process is desirably performed in inert gas considering moisture absorption of the formed layer (film) and deterioration of the material. Moreover, the first electrode 3 and/or the second electrode may be formed by the transfer method.

Figure 2:
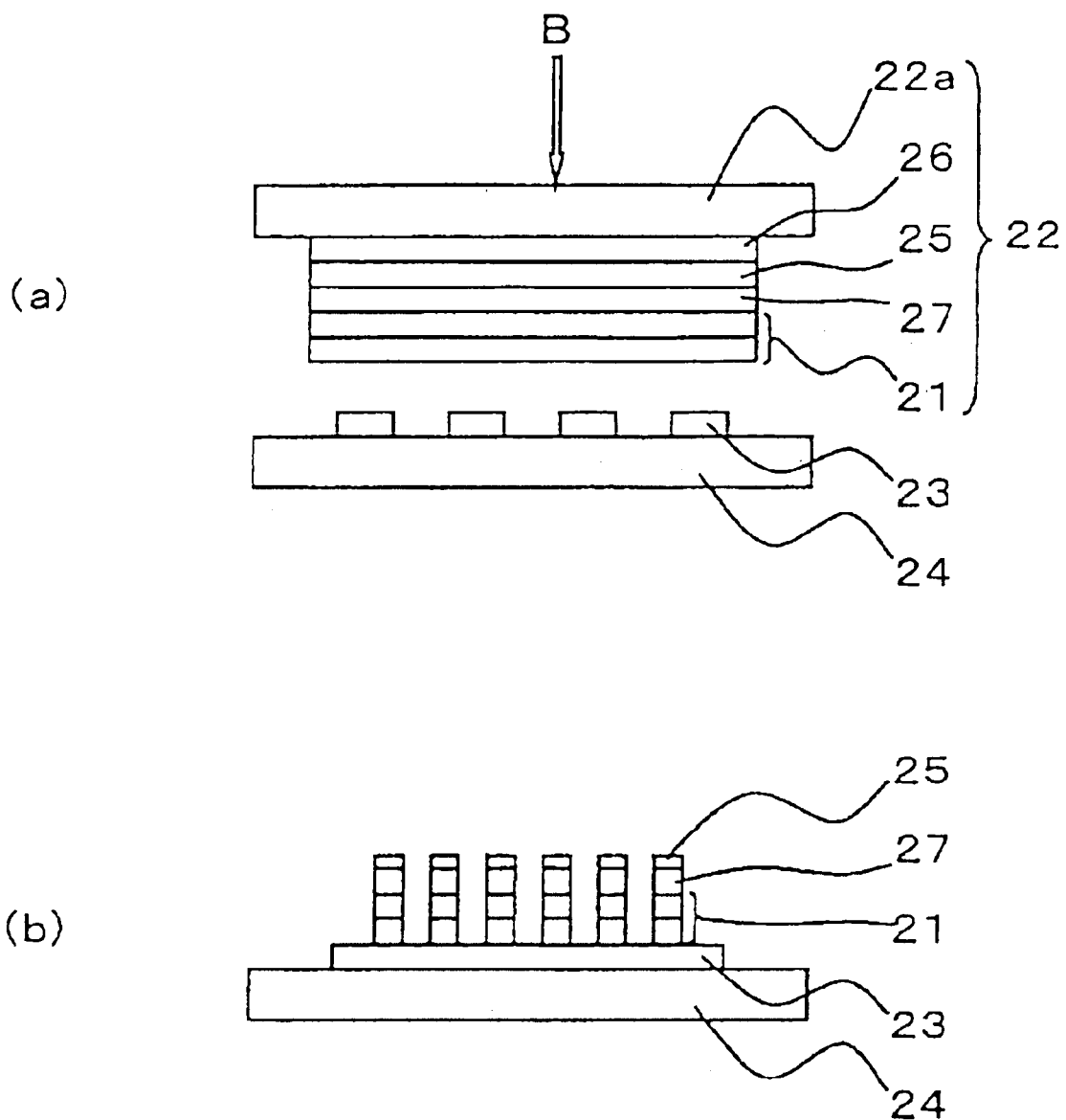
FIG. 2 is a typical sectional view showing a transfer film and a process for producing an organic EL device using the same in another embodiment of the present invention.

FIGS. 2(a) and (b) are typical sectional views each showing a transfer film of another embodiment in the invention and a process for producing an organic EL device using the same. FIG. 2(b) is a typical sectional view when seen from a side perpendicular to the side shown in FIG. 2(a).

As shown in FIGS. 2(a) and (b), a transfer film 22 on which a transfer layer 21, is formed and a substrate 24 on which a first electrode 23 is formed are attached to each other such that the transfer layer 21 opposes to the first electrode 23. Then, laser B is irradiated from a base film 22a side (from a base film 2a side of the transfer film 22). Formed between the base film 22a and the transfer layer 21 are a transfer auxiliary layer 25 that is in contact with at least the transfer layer 21 and has a melting point lower than that of the transfer layer 21 and a light-to-heat conversion layer 26. The laser light B is converted into heat at the light-to-heat conversion layer 26. A portion of the transfer auxiliary layer 25 that is heated by the converted heat is fused, so that at least a portion of the transfer layer 21 is transferred onto the substrate 24. Thereafter, a second electrode 27 is formed according to need, to thereby complete an organic EL device. A series of the transfer process is desirably performed in inert gas considering moisture absorption of the formed layer (film) and deterioration of the material. Moreover, of the first electrode 23 and/or the second electrode 27 electrodes may be formed by the transfer method. This embodiment shows the case where the second electrode 27 is formed simultaneous with the other transfer layer 21.

In the present invention, the transfer layer may be a single-layer structure or a multi-layer structure. When the transfer layer has a multi-layer structure including all the constituent layers of the organic EL device, the transfer process completes in one cycle. On the other hand, the aforesaid transfer process is required to be repeated in case where the transfer layer has a single-layer structure or a multi-layer structure including a portion of the constituent layers of the organic EL device.

An organic EL device may be formed by combining the transfer method using the transfer film of the invention with the known dry process and/or the wet process. Examples of the known dry process include a vacuum vapor-deposition method, EB method, MBE method, sputtering method or the like. Examples of the known wet process include a coating method such as a spin coating method, dip coating method, doctor blade method, discharge coating method, spray coating method or the like, and a printing method such as ink jet method, letterpress printing method, intaglio printing method, screen printing method, microgravure coating method or the like.

Figure 3:
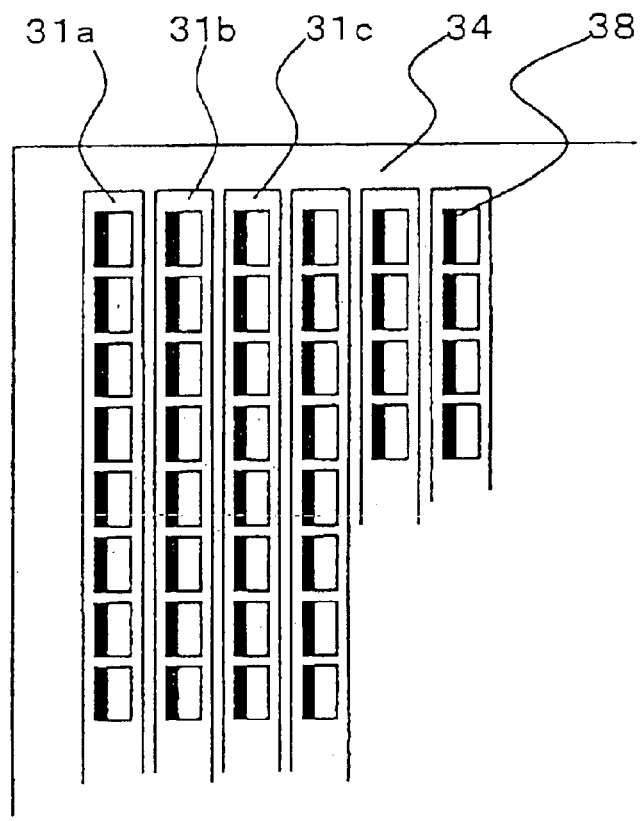
FIG. 3 is a typical plane view showing an organic EL device manufactured by using the embodiment of the present invention.
Figure 4:
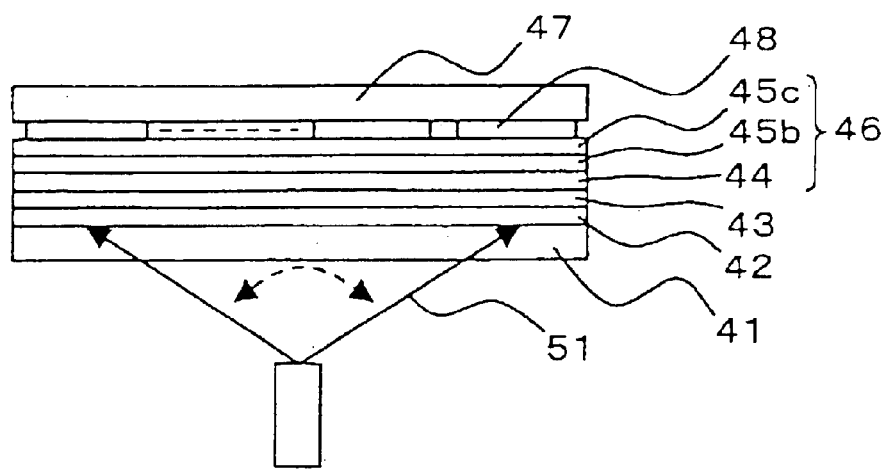
FIG. 4 is a typical sectional view showing a conventional transfer film and a process for producing an organic EL device using the same.

FIG. 3 is a typical plane view showing one example of an organic EL device manufactured by using the embodiment of the present invention.

As shown in FIG. 3, using a transfer film having formed on a base film an organic red light-emitting multi-layer film 31a (e.g., made of hole transporting layer/red light-emitting layer), an organic green light-emitting multi-layer film 31b (e.g., made of hole transporting layer/green light-emitting layer) and an organic blue light-emitting multi-layer film 31c (e.g., made of hole transporting layer/blue light-emitting layer), a transfer process is repeated to thereby form an organic EL device of a multi-color emission comprising on a substrate 34 red, green and blue light-emitting multi-layer films. A switching element 38 such as a thin-film transistor is formed every pixel on the substrate 34.

EXAMPLE

Subsequently, the present invention will further be explained in detail with reference to specific examples. It is to be noted that the invention is not limited by these examples.

Example 1

Polyethylene terephthalate with a thickness of 150 μm was used as a base film. Formed thereon was a layer of stearic acid with a thickness of 100 nm by a vapor-deposition method as a transfer auxiliary layer. The melting point of stearic acid was 68° C. Further, (8-hydroxyquinolinato) aluminum complex ($Alq_3$) (melting point: 413° C., glass transition temperature: 175° C.) serving as the organic light-emitting layer and N,N'-di(naphthalene-1-yl)-N,N'-diphenyl-bendizine (NPD) (melting point: 275° C., glass transition temperature: 95° C.) serving as the hole transporting material were formed by the vapor-deposition method, each having a thickness of 50 nm. The transfer film thus manufactured was attached to a glass substrate that was patterned in advance to have a transparent electrode formed thereon. A linear heat source (e.g., nichrome line through which electric current flows) was pushed to the resultant from the base film side for fusing the transfer auxiliary layer, whereby the transfer layer was pattern-transferred onto the glass substrate having the transparent electrode formed thereon. The melting point of stearic acid was lower than the glass transition temperature of $Alq_3$, so that the transfer layer was not deteriorated due to heat upon the transfer. A cathode was formed after the transfer on the transfer layer, with the result that a green light emission from $Alq_3$ was recognized.

If the transfer process was performed three times by using, in addition to the aforementioned transfer film, each of the transfer films having formed thereon an organic light-emitting layer showing a red light emission and blue light emission, an organic EL device capable of emitting full-color of R, G and B can be produced.

Example 2

A transfer was performed by the same manner as in the Example 1 except that any one of a multi-layer film of Al layer/$Alq_3$ layer/NPD layer, a multi-layer film of light transmitting metal thin-film Al layer/$Alq_3$ layer/NPD layer and a multi-layer film of transparent conductive layer/NPD layer/$Alq_3$ layer was used for the transfer layer. A satisfactory transfer could also be obtained. Transferring simultaneously an electrode layer enabled reduction in the number of process.

Generally, materials used for the electrode layer are inorganic and have a greater hardness than organic materials. Therefore, their thickness is preferably thin in order to perform a satisfactory transfer. Moreover, the structure of the multi-layer film of metal thin-film Al layer/$Alq_3$ layer/NPD layer or the multi-layer film of transparent conductive film layer/NPD layer/$Alq_3$ layer enables to take the emission from the side opposite to the substrate, whereby the decrease of aperture ratio can be prevented in the case of executing an active operation using a switching element such as TFT.

Example 3

Polyethylene terephthalate with a thickness of 150 µm was used as a base film. Formed thereon as a light-to-heat conversion layer was a layer in which carbon black was dispersed in a polymer material. The transfer auxiliary layer, hole transporting layer and light-emitting layer were formed by the same manner as in Example 1. The transfer film thus manufactured was attached to a glass substrate that was patterned in advance to have a transparent electrode formed thereon. Laser light was irradiated to the resultant from the base film side for fusing the transfer auxiliary layer by utilizing the heat at the light-to-heat conversion layer, whereby the transfer layer was pattern-transferred onto the glass substrate having the transparent electrode formed thereon. Power of the laser light was optionally selected to thereby obtain a satisfactory transfer layer. A cathode was formed after the transfer on the transfer layer, with the result that a green light emission from $Alq_3$ was recognized.

The laser light can be converged onto a small spot by an optical system such as a lens. Therefore, the use of the laser light can facilitate the production of the transfer layer having narrow transfer width, thereby being capable of achieving high precision of the organic EL device. The light-to-heat conversion layer can be formed by using, for example, the one in which aluminum, metal film made of its oxide/sulfide, graphite, infrared dye or the like is dispersed in the polymer material.

Example 4

A transfer was performed by the same manner as in the Example 1 except that the transfer auxiliary layer and the transfer layer were formed continuously in a vacuum. The continuous formation of each layer in a vacuum can reduce the deterioration occurred at the interface of each layer due to atmosphere, thereby improving the characteristics of the organic EL device.

Although each of the aforesaid examples describes the case where a low-molecular compound was used for the organic light-emitting layer and hole transporting layer, the same result can be obtained when a polymer material is used. In the case of the polymer material, the transfer is preferably performed in nitrogen atmosphere since the formation is made by a coating method.

A transfer film of the present invention is characterized by comprising a base film, a transfer layer, and a transfer auxiliary layer formed between the base film and the transfer layer so as to be in contact with at least the transfer layer, this transfer auxiliary layer having a melting point or a glass transition temperature lower than that of the transfer layer, wherein at least a portion of the transfer layer can be thermally transferred onto a substrate. According to the present invention, a transfer can be performed at a low temperature compared to the case where the transfer auxiliary layer is not formed. Accordingly, a transfer is possible that does not give damages to the transfer layer due to heat, thereby being capable of providing a transfer film for performing a satisfactory transfer without deteriorating the inherent function of the transfer layer.

Further, the transfer layer of the transfer film according to the present invention has an EL layer containing at least an organic light-emitting material. Even in case where an organic EL material that is generally susceptible to thermal influence is used for the transfer layer, this structure enables a transfer of the organic EL layer that does not suffer from damages due to heat, thereby being capable of providing a transfer film for performing a transfer of the organic EL layer having satisfactory light-emitting characteristics.

Moreover, the transfer layer of the transfer film according to the present invention has a metal electrode layer that can simultaneously be transferred, whereby a plurality of layers including the metal electrode layer can simultaneously be transferred. Consequently, the number of the transfer film used upon producing the organic EL device can be decreased, thereby being capable of attaining the reduction in the number of the process and the reduction in cost.

Additionally, the metal electrode layer of the transfer film according to the present invention is a metal thin-film layer that transmits light, thereby being capable of producing an organic EL device that can take out light from the side opposite to the substrate, i.e., an organic EL device having a structure of so-called top emission structure. Consequently, a aperture ratio per one pixel can be made great in the case of, for example, using a substrate having TFT formed thereon. Further, light can be taken out from both sides of the organic EL device, to thereby expand the usage of the organic EL device such that it is applied to, for example, a double-sided display panel.

Further, the transfer layer of the transfer film according to the present invention has a transparent conductive film layer. This structure enables to produce an organic EL device having a so-called reversed multi-layer structure in which light is taken out from the side opposite to the substrate, thereby increasing the aperture ratio per one pixel in the case of using a substrate having TFT formed thereon.

Moreover, the transfer auxiliary layer and the transfer layer of the transfer film according to the present invention are formed continuously in inert gas or in a vacuum. This formation prevents the transfer film from being exposed to atmosphere during its production, to thereby be capable of preventing the deterioration at the interface of each layer. Consequently, the present invention can provide a transfer film capable of performing a satisfactory transfer without deteriorating the inherent function of the transfer layer.

A process for producing an organic EL device of the present invention is characterized by comprising the step of attaching to a substrate a transfer film comprising a base film, a transfer layer to be a constituent layer of the organic EL device and a transfer auxiliary layer formed between the base film and the transfer layer so as to be in contact with at least the transfer layer, this transfer auxiliary layer having a melting point or a glass transition temperature lower than that of the transfer layer, such that the transfer layer is in contact with a face of the substrate on which the transfer layer is to be transferred: and the step of heating the transfer auxiliary layer from the base film side for transferring at least a portion of the transfer layer onto the substrate, to thereby form the constituent layer of the organic EL device. According to the present invention, an organic layer can be transferred in various forms at a temperature that does not give damages due to heat. Specifically, an organic EL device according to various forms of use can be manufactured, to thereby be capable of providing various types of organic EL device having satisfactory light-emitting performance.

Further, a process for producing an organic EL device of the present invention is characterized in that the step of heating is partially performed to the transfer auxiliary layer at a base film side for forming a patterned light-emitting section of the organic EL device. According to the invention, not only the entire surface emits light but also emission can be obtained with an optional pattern. Therefore, it is possible to produce an organic EL device capable of being driven with matrix operation, thereby being capable of providing an organic EL device that can perform character display, graphic display, image display or the like.

Moreover, the patterned light-emitting section in a process for producing an organic EL device of the present invention has a plurality of luminescent colors. This structure enables to produce an organic EL device that can easily perform with high performance a multi-color display or a full-color display, thereby being capable of providing an organic EL device affording a great deal of display information by a color display.

Additionally, a process for producing an organic EL device of the present invention is characterized in that the transfer film has a light-to-heat conversion layer at a base film side, and the step of heating is partially performed to the transfer auxiliary layer at the base film side by light irradiation. This structure enables a batch transfer to a substrate having a large area by using, for example, a photomask or the like, whereby manufacturing cost can be reduced. Consequently, an inexpensive organic EL device can be provided.

Further, the light irradiation in a process for producing an organic EL device of the present invention is performed by using laser light. The laser light can be converged onto a small spot, and hence makes it possible to perform a high-precise patterning. Therefore, a high-precise organic EL device can be provided that is capable of being utilized for a display section of a cellular terminal.

What is claimed is:

1. A transfer film comprising a base film, a transfer layer, and a transfer auxiliary layer formed between the base film and the transfer layer so as to be in contact with at least the transfer layer, wherein this transfer auxiliary layer comprises a compound selected from the group consisting of diphenylamine, triphenylene, para-terphenyl, stearic acid and behenic acid and has a melting point or a glass transition temperature lower than that of the transfer layer, wherein at least a portion of the transfer layer can be thermally transferred onto a substrate and wherein the transfer layer has an electroluminescent layer containing at least an organic light-emitting material or the transfer layer has a transparent conductive film layer that transmits light.

2. A transfer film according to claim 1, wherein the transfer auxiliary layer comprises stearic acid.

3. A transfer film according to claim 1, wherein the transfer layer is an organic layer or a combination of at least one electrode layer and the organic layer to be a constituent layer of an organic electroluminescent device, and the organic layer is of a single-layer structure or of a multi-layer structure formed of one or more layers selected from an organic light-emitting layer, a hole transporting layer, an electron transporting layer, a hole injecting layer and a blocking layer.

4. A transfer film according to claim 1, wherein the transfer layer has an electroluminescent layer containing at least an organic light-emitting material.

5. A transfer film according to claim 1, wherein the transfer layer has a metal electrode layer.

6. A transfer film according to claim 5, wherein the metal electrode layer is a metal thin-film layer that transmits light.

7. A transfer film according to claim 1, wherein the transfer layer has a transparent conductive film layer.

8. A transfer film according to claim 1, wherein the transfer auxiliary layer and the transfer layer are formed continuously in inert gas or in a vacuum.

9. A transfer film according to claim 1, wherein the base film has a light-to-heat conversion layer at a transfer layer side thereof.

10. A transfer film according to claim 1, wherein the transfer layer is a multi-layer film of (8-hydroxyquinolinato) aluminum complex ($Alq_3$) layer/N,N'-di(naphthalene-1-yl)-N,N'-diphenyl-bendizine (NPD) layer, a multi-layer film of Aluminum (Al) layer/$Alq_3$ layer/NPD layer, a multi-layer film of light transmitting metal thin-film Al layer/$Alq_3$ layer/NPD layer or a multi-layer film of transparent conductive layer/NPD layer/$Alq_3$ layer.

11. A process for producing an organic electroluminescent device comprising the step of attaching to a substrate a transfer film comprising a base film, a transfer layer to be a constituent layer of the organic electroluminescent device and a transfer auxiliary layer formed between the base film and the transfer layer so as to be in contact with at least the transfer layer, wherein this transfer auxiliary layer comprises a compound selected from the group consisting of diphenylamine, triphenylene, para-terphenyl, stearic acid and behenic acid and has melting point or a glass transition temperature lower than that of the transfer layer, in such a manner that the transfer layer is in contact with a face of the substrate on which the transfer layer is to be transferred; and the step of heating the transfer auxiliary layer from the base film side for transferring at least a portion of the transfer layer onto the substrate, to thereby form the constituent layer of the organic electroluminescent device.

12. A process for producing an organic electroluminescent device according to claim 11, wherein the step of heating is partially performed to the transfer auxiliary layer at the base film side for forming a patterned light-emitting section of the organic electroluminescent device.

13. A process for producing an organic electroluminescent device according to claim 12, wherein the patterned light-emitting section has a plurality of luminescent colors.

14. A process for producing an organic electroluminescent device according to claim 11, wherein the transfer film has a light-to-heat conversion layer at a transfer layer side of the base film, and the step of heating is partially performed to the transfer auxiliary layer at the base film side by light irradiation.

15. A process for producing an organic electroluminescent device according to claim 14, wherein the light irradiation is performed by using laser light irradiation.

* * * * *